US012810954B2

(12) United States Patent
Wang et al.

(10) Patent No.: US 12,810,954 B2
(45) Date of Patent: Nov. 24, 2026

(54) SHIFT REGISTER UNIT, DRIVE CONTROL CIRCUIT, DISPLAY APPARATUS AND DRIVE METHOD

(71) Applicants: Chongqing BOE Display Technology Co., Ltd., Chongqing (CN); BOE Technology Group Co., Ltd., Beijing (CN)

(72) Inventors: Rui Wang, Beijing (CN); Runxin Zhang, Beijing (CN); Ming Hu, Beijing (CN); Shouqiang Zhang, Beijing (CN); Haijun Qiu, Beijing (CN); Yinglong Huang, Beijing (CN); Kai Zhang, Beijing (CN); Zhi Huang, Beijing (CN); Xueguang Hao, Beijing (CN); Chao Zeng, Beijing (CN)

(73) Assignees: Chongqing BOE Display Technology Co., Ltd., Chongqing (CN); Beijing BOE Technology Development Co., Ltd., Beijing (CN)

( * ) Notice: Subject to any disclaimer, the term of this patent is extended or adjusted under 35 U.S.C. 154(b) by 262 days.

(21) Appl. No.: 18/707,993

(22) PCT Filed: Jul. 28, 2023

(86) PCT No.: PCT/CN2023/110009
§ 371 (c)(1),
(2) Date: May 7, 2024

(87) PCT Pub. No.: WO2025/025010
PCT Pub. Date: Feb. 6, 2025

(65) Prior Publication Data

US 2026/0162742 A1 Jun. 11, 2026

(51) Int. Cl.
*G09G 3/36* (2006.01)
*G09G 3/20* (2006.01)
*G11C 19/28* (2006.01)

(52) U.S. Cl.
CPC ............. *G11C 19/287* (2013.01); *G09G 3/20* (2013.01); *G09G 2300/0408* (2013.01); *G09G 2310/0267* (2013.01); *G09G 2310/0286* (2013.01)

(58) Field of Classification Search
CPC ................... G11C 19/287; G09G 3/20; G09G 2300/0408; G09G 2310/0267; G09G 2310/0286; G09G 3/3677
See application file for complete search history.

(56) References Cited

U.S. PATENT DOCUMENTS

2016/0365052 A1 12/2016 Park et al.
2020/0294461 A1* 9/2020 Xu ....................... G09G 3/3677

FOREIGN PATENT DOCUMENTS

CN 105825799 A 8/2016
CN 105957556 A 9/2016
(Continued)

*Primary Examiner* — Abdul-Samad A Adediran
(74) *Attorney, Agent, or Firm* — ArentFox Schiff LLP; Michael Fainberg

(57) ABSTRACT

Disclosed are a shift register unit, a drive control circuit, a display apparatus and a drive method. The shift register unit includes an input circuit configured to provide a signal from the signal input terminal to the first node in response to a signal from the first clock signal terminal; a first stabilizer circuit, configured to provide a signal from a stability control signal terminal to the first node in response to a signal from a switch control signal terminal; a conducting control circuit configured to establish a conducting path between the first node and the second node in response to a signal from a first reference signal terminal; and an output circuit configured to
(Continued)

provide a signal from the second clock signal terminal to the signal output terminal in response to a signal at the second node.

17 Claims, 6 Drawing Sheets

(56) References Cited

FOREIGN PATENT DOCUMENTS

| | | | |
|---|---|---|---|
| CN | 208141796 | U | 11/2018 |
| CN | 109559684 | A | 4/2019 |
| CN | 110956919 | A | 4/2020 |
| CN | 111739473 | A | 10/2020 |
| CN | 111754944 | A | 10/2020 |
| CN | 113851174 | A | 12/2021 |
| CN | 113920937 | A | 1/2022 |

* cited by examiner

SHIFT REGISTER UNIT, DRIVE CONTROL CIRCUIT, DISPLAY APPARATUS AND DRIVE METHOD

CROSS REFERENCE TO RELATED APPLICATIONS

This application is a national phase entry under 35 U.S.C. § 371 of International Application No. PCT/CN 2023/110009, filed on Jul. 28, 2023, the entire content of which is incorporated herein by reference.

TECHNICAL FIELD

The disclosure relates to the field of display technology, in particular to a shift register unit, a drive control circuit, a display apparatus and a drive method.

BACKGROUND

In recent years, the development of displays has shown a trend toward high integration and low cost. One of the most important technologies is the realization of the mass production of a Gate Driver on Array (GOA). The GOA technology is used to integrate a drive control circuit on an array substrate of a display panel to achieve scan drive of the display panel, so that a gate drive integrated circuit may be omitted, and the product cost may be reduced from both material cost and manufacturing process. The drive control circuit is usually composed of a plurality of cascaded shift register units. If output of the shift register unit is unstable, display will be abnormal.

SUMMARY

The disclosure provides a shift register unit, a drive control circuit, a display apparatus and a drive method. A specific solution is as follows.

A shift register unit provided in embodiments of the disclosure includes: an input circuit, coupled with a signal input terminal, a first clock signal terminal and a first node, and configured to provide a signal from the signal input terminal to the first node in response to a signal from the first clock signal terminal; a first stabilizer circuit, coupled with the first node, a switch control signal terminal and a stability control signal terminal, and configured to provide a signal from the stability control signal terminal to the first node in response to a signal from the switch control signal terminal; a conducting control circuit, coupled with the first node and a second node, and configured to establish a conducting path between the first node and the second node in response to a signal from a first reference signal terminal; and an output circuit, coupled with the second node, a second clock signal terminal and a signal output terminal, and configured to provide a signal from the second clock signal terminal to the signal output terminal in response to a signal at the second node to allow a drive signal to be output from the signal output terminal.

Optionally, in the embodiment of the disclosure, the first stabilizer circuit includes a first transistor, a first electrode of the first transistor is coupled with the first node, a second electrode of the first transistor is coupled with the stability control signal terminal, and a gate electrode of the first transistor is coupled with the switch control signal terminal.

Optionally, in the embodiment of the disclosure, the shift register unit further includes a second stabilizer circuit, where the second stabilizer circuit includes a first capacitor and a second transistor. A gate electrode of the second transistor and a first electrode of the first capacitor are both coupled with a third node, a first electrode of the second transistor is coupled with the second clock signal terminal, and a second electrode of the second transistor is coupled with a second electrode of the first capacitor.

Optionally, in the embodiment of the disclosure, the switch control signal terminal is coupled with the second electrode of the first capacitor.

Optionally, in the embodiment of the disclosure, the switch control signal terminal and the second clock signal terminal are the same signal terminal.

Optionally, in the embodiment of the disclosure, the stability control signal terminal and the signal output terminal are the same signal terminal.

Optionally, in the embodiment of the disclosure, the stability control signal terminal and a second reference signal terminal are the same signal terminal.

Optionally, in the embodiment of the disclosure, the input circuit includes a third transistor. A gate electrode of the third transistor is coupled with the first clock signal terminal, a first electrode of the third transistor is coupled with the signal input terminal, and a second electrode of the third transistor is coupled with the first node.

Optionally, in the embodiment of the disclosure, the conducting control circuit includes a fourth transistor. A gate electrode of the fourth transistor is coupled with the first reference signal terminal, a first electrode of the fourth transistor is coupled with the first node, and a second electrode of the fourth transistor is coupled with the second node.

Optionally, in the embodiment of the disclosure, the output circuit includes a second capacitor and a fifth transistor. A first electrode of the second capacitor and a gate electrode of the fifth transistor are both coupled with the second node; and a first electrode of the fifth transistor is coupled with the second clock signal terminal, and a second electrode of the fifth transistor and a second electrode of the second capacitor are both coupled with the signal output terminal.

Optionally, in the embodiment of the disclosure, the shift register unit further includes: a first control circuit, coupled with the third node, and configured to provide the signal from the first reference signal terminal to the third node in response to the signal from the first clock signal terminal, and provide the signal from the first clock signal terminal to the third node in response to the signal at the first node; and a second control circuit, coupled with the signal output terminal, and configured to provide a signal from the second reference signal terminal to the signal output terminal in response to a signal at the third node.

Optionally, in the embodiment of the disclosure, the first control circuit includes a sixth transistor and a seventh transistor. A gate electrode of the sixth transistor is coupled with the first clock signal terminal, a first electrode of the sixth transistor is coupled with the first reference signal terminal, and a second electrode of the sixth transistor is coupled with the third node. A gate electrode of the seventh transistor is coupled with the first node, a first electrode of the seventh transistor is coupled with the first clock signal terminal, and a second electrode of the seventh transistor is coupled with the third node.

Optionally, in the embodiment of the disclosure, the second control circuit includes an eighth transistor and a third capacitor. A gate electrode of the eighth transistor is coupled with the third node, a first electrode of the eighth transistor is coupled with the signal output terminal, and a second electrode of the eighth transistor is coupled with the second reference signal terminal. A first electrode of the third capacitor is coupled with the second reference signal terminal, and a second electrode of the third capacitor is coupled with the third node. Correspondingly, a drive control circuit provided in embodiments of the disclosure includes: a plurality of cascaded shift register units. A signal input terminal of a first shift register unit is coupled with a frame trigger signal terminal; and in every two adjacent levels of shift register units, a signal input terminal of a next shift register unit is coupled with a signal output terminal of a previous shift register unit.

Correspondingly, a display apparatus provided in embodiments of the disclosure includes the drive control circuit as described above.

Correspondingly, a drive method of the above shift register unit provided in embodiments of the disclosure includes: in a first stage, the input circuit providing a signal from the signal input terminal to the first node in response to the signal from the first clock signal terminal; the conducting control circuit establishing a conducting path between the first node and a second node in response to the signal from the first reference signal terminal; and the output circuit providing the signal from the second clock signal terminal to the signal output terminal in response to the signal at the second node; in a second stage, the output circuit providing the signal from the second clock signal terminal to the signal output terminal in response to the signal at the second node to allow the drive signal to be output from the signal output terminal; and in a third stage, the input circuit providing the signal from the signal input terminal to the first node in response to the signal from the first clock signal terminal; and the first stabilizer circuit providing the signal from the stability control signal terminal to the first node in response to the signal from the switch control signal terminal.

Optionally, in the embodiment of the disclosure, after the third stage, the drive method further includes: in a fourth stage, the first stabilizer circuit providing the signal from the stability control signal terminal to the first node in response to the signal from the switch control signal terminal and a second stabilizer circuit providing the signal from the second clock signal terminal to a fourth node in response to a signal at the third node; and the conducting control circuit establishing a conducting path between the first node and the second node in response to the signal from the first reference signal terminal.

Optionally, in the embodiment of the disclosure, the drive method further includes: in the first stage, a first control circuit providing the signal from the first reference signal terminal to the third node in response to the signal from the first clock signal terminal, and providing the signal from the first clock signal terminal to the third node in response to the signal at the first node; and a second control circuit providing a signal at a second reference signal terminal to the signal output terminal in response to the signal at the third node; in the second stage, the first control circuit providing the signal from the first clock signal terminal to the third node in response to the signal at the first node; in the third stage, the first control circuit providing the signal from the first reference signal terminal to the third node in response to the signal from the first clock signal terminal; and the second control circuit providing the signal from the second reference signal terminal to the signal output terminal in response to the signal at the third node; and in the fourth stage, the second control circuit providing the signal from the second reference signal terminal to the signal output terminal in response to the signal at the third node.

DETAILED DESCRIPTION

Figure 1:
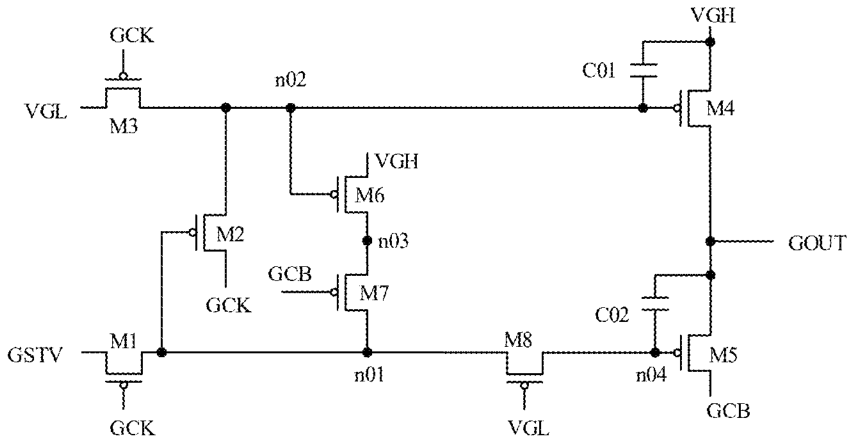
FIG. 1 is a schematic structural diagram of a shift register unit in the related art.

In order to make the objectives, technical solutions, and advantages of embodiments of the disclosure clearer, the technical solutions of the embodiments of the disclosure will be described clearly and completely in conjunction with accompanying drawings of the embodiments of the disclosure. Obviously, the described embodiments are some, not all, of the embodiments of the disclosure. In addition, the embodiments and features in the embodiments of the disclosure may be combined with each other without conflict. Based on the described embodiments of the disclosure, all other embodiments obtained by those of ordinary skill in the art without the need for creative labor fall within the scope of protection of the disclosure.

Unless otherwise defined, technical or scientific terms used in the disclosure shall have the common meanings understood by those of ordinary skill in the art to which the disclosure belongs. “First”, “second” and similar words used in the disclosure do not indicate any order, quantity or importance, but are only used to distinguish different components. “Include” or “comprise” and other similar words mean that an element or item appearing before the word encompasses elements or items listed after the word and their equivalents, without excluding other elements or items. “Connect” or “link” and other similar words are not limited to physical or mechanical connections, but may include electrical connections, whether direct or indirect. “Inner”, “outer”, “up”, “down”, etc. are only used to indicate the relative position relationship. When an absolute position of a described object changes, the relative position relationship may also change accordingly.

It should be noted that the size and shape of each figure in the accompanying drawings do not reflect a true scale, but are only intended to illustrate the content of the disclosure. The same or similar reference numerals indicate the same or similar elements or elements with the same or similar functions throughout.

Figure 2:
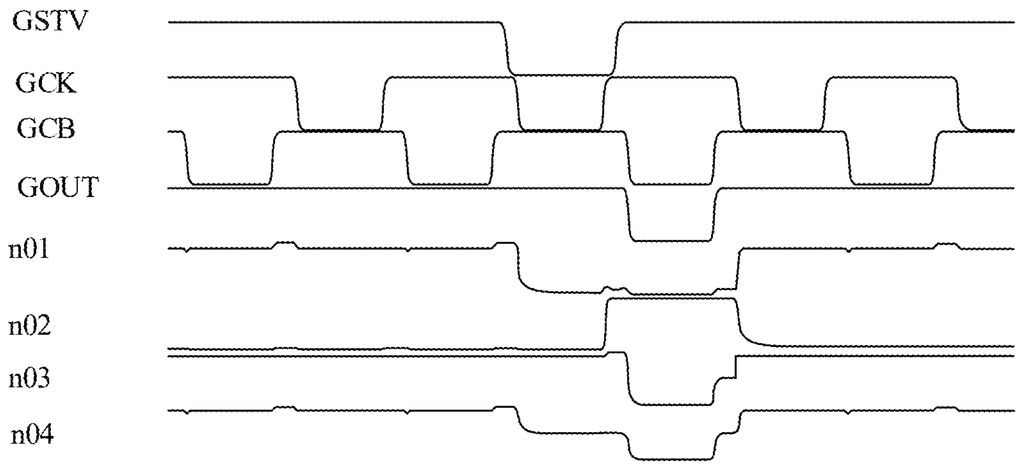
FIG. 2 is a schematic diagram showing simulation waveforms of voltage at the respective nodes of the shift register unit in FIG. 1 in a working state.

In the related art, as shown in FIG. 1 and FIG. 2, FIG. 1 is a schematic structural diagram of a shift register unit in a Gate GOA, the shift register unit includes transistors M1 to M8 and capacitors C01 and C02, and FIG. 2 is a schematic diagram showing simulation waveforms of voltages at the respective nodes of the shift register unit as shown in FIG. 1 in a working state. In a period while Gout is kept at a high level, node n2 is pulled down only through VGL when GCK is set at a low level, and once there is a voltage jump at the node n2 due to coupling, voltage instability is likely to occur when GCK is at the high level, thus affecting the output stability of Gout.

Figure 3:
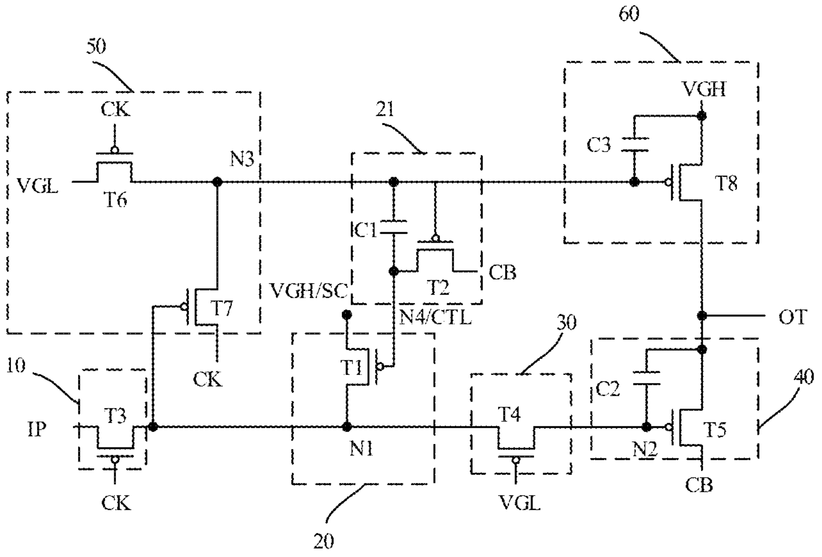
FIG. 3 is a schematic structural diagram of some structures of a shift register unit provided in embodiments of the disclosure.

In view of this, embodiments of the disclosure provide a shift register unit, and as shown in FIG. 3, the shift register unit includes:

an input circuit 10, coupled with a signal input terminal IP, a first clock signal terminal CK and a first node N1, and configured to provide a signal from the signal input terminal IP to the first node N1 in response to a signal from the first clock signal terminal CK;

a first stabilizer circuit 20, coupled with the first node N1, a switch control signal terminal CTL and a stability control signal terminal SC, and configured to provide a signal from the stability control signal terminal SC to the first node N1 in response to a signal from the switch control signal terminal CTL; where in a specific implementation, the switch control signal terminal CTL may include both an interface of a signal line and a node in a circuit.

a conducting control circuit 30, coupled with the first node N1 and a second node N2, and configured to establish a conducting path between the first node N1 and the second node N2 in response to a signal from a first reference signal terminal VGL; and an output circuit 40, coupled with the second node N2, a second clock signal terminal CB and a signal output terminal OT, and configured to provide a signal from the second clock signal terminal CB to the signal output terminal OT in response to a signal at the second node N2, to enable a drive signal to be output from the signal output terminal OT.

In the embodiments of the disclosure, through the coordination of the input circuit 10, the first stabilizer circuit 20, the conducting control circuit 30 and the output circuit 40, the drive signal may be output from the signal output terminal OT, which realizes a drive process of a coupled signal. Moreover, by arranging the first stabilizer circuit 20, the signal from the stability control signal terminal SC may be provided to the first node N1 at a third stage, so that the output circuit 40 may be cut off as fast as possible, and a level of the signal at the first node N1 may be kept stable, thus improving stability of the signal output from the signal output terminal OT and ensuring drive performance of the shift register unit.

In the embodiments of the disclosure, as shown in FIG. 3, the first stabilizer circuit 20 includes a first transistor T1, a first electrode of the first transistor T1 is coupled with the first node N1, a second electrode of the first transistor T1 is coupled with the stability control signal terminal SC, and a gate electrode of the first transistor T1 is coupled with the switch control signal terminal CTL.

In a specific implementation, the first transistor T1 may be turned on under the control of an active level of a switch control signal transmitted from the switch control signal terminal CTL, and may be turned off under the control of an invalid level of the switch control signal. For example, the first transistor T1 is a P-type transistor, then a low level of the switch control signal is the active level, and a high level of the switch control signal is the invalid level. For example, the first transistor T1 is an N-type transistor, then a high level of the switching control signal is the active level, and a low level of the switching control signal is the invalid level.

In the embodiments of the disclosure, as shown in FIG. 3, the shift register unit further includes a second stabilizer circuit 21, and the second stabilizer circuit 21 includes a first capacitor C1 and a second transistor T2. A gate electrode of the second transistor T2 and a first electrode of the first capacitor C1 are both coupled with a third node N3, a first electrode of the second transistor T2 is coupled with the second clock signal terminal CB, and a second electrode of the second transistor T2 is coupled with a second electrode of the first capacitor C1.

In a specific implementation, the gate electrode of the second transistor T2 and the first electrode of the first capacitor C1 are both coupled with the third node N3, in this case, the second transistor T2 may be turned on under the control of an active level of a signal at the third node N3, and turned off under the control of an invalid level of the signal at the third node N3. For example, the second transistor T2 is an N-type transistor, a high level of the signal at the third node N3 is the active level, and a low level of the signal at the third node N3 is the invalid level. For example, the second transistor T2 is a P-type transistor, a low level of the signal at the third node N3 is the active level, and a high level of the signal at the third node N3 is the invalid level.

In the embodiment of the disclosure, as shown in FIG. 3, the switch control signal terminal CTL is coupled with the second electrode of the first capacitor C1.

For example, the switch control signal terminal CTL and the second electrode of the first capacitor C1 are both coupled with a fourth node N4 in FIG. 3.

In the embodiments of the disclosure, as shown in FIG. 3, the stability control signal terminal SC and a second reference signal terminal VGH are the same signal terminal.

For example, the stability control signal terminal SC and the second reference signal terminal VGH may be coupled together, which may reduce the quantity of signal lines and reduce the difficulty of wiring.

In the embodiments of the disclosure, as shown in FIG. 3, the input circuit 10 includes a third transistor T3. A gate electrode of the third transistor T3 is coupled with the first clock signal terminal CK, a first electrode of the third transistor T3 is coupled with the signal input terminal IP, and a second electrode of the third transistor T3 is coupled with the first node N1.

In a specific implementation, the third transistor T3 may be turned on under the control of an active level of a first clock signal transmitted from the first clock signal terminal CK, and may be turned off under the control of an invalid level of the first clock signal transmitted from the first clock signal terminal CK. For example, the third transistor T3 is an N-type transistor, a high level of the first clock signal is the active level, and a low level of the first clock signal is the invalid level. For example, the third transistor T3 is a P-type transistor, a low level of the first clock signal is the active level, and a high level of the first clock signal is the invalid level.

In the embodiments of the disclosure, as shown in FIG. 3, the conducting control circuit 30 includes a fourth transistor T4. A gate electrode of the fourth transistor T4 is coupled with the first reference signal terminal VGL, a first electrode of the fourth transistor T4 is coupled with the first node N1, and a second electrode of the fourth transistor T4 is coupled with the second node N2.

In a specific implementation, the fourth transistor T4 may be turned on under the control of an active level of a first reference signal transmitted from the first reference signal terminal VGL and may be turned off under the control of an invalid level of the first reference signal transmitted from the first reference signal VGL. For example, the fourth transistor T4 is an N-type transistor, a high level of the first reference signal is the active level, and a low level of the first reference signal is the invalid level. For example, the third transistor T3 is a P-type transistor, a low level of the first reference signal is the active level, and a high level of the first reference signal is the invalid level.

In the embodiments of the disclosure, as shown in FIG. 3, the output circuit 40 includes a second capacitor C2 and a fifth transistor T5.

A first electrode of the second capacitor C2 and a gate electrode of the fifth transistor T5 are both coupled with the second node N2.

A first electrode of the fifth transistor T5 is coupled with the second clock signal terminal CB, and a second electrode of the fifth transistor T5 and a second electrode of the second capacitor C2 are both coupled with the signal output terminal OT.

In a specific implementation, the fifth transistor T5 may be turned on under the control of an active level of a signal at the second node N2, and may be turned off under the control of an invalid level of the signal at the second node N2. For example, the fifth transistor T5 is an N-type transistor, a high level of the signal at the second node N2 is the active level, and a low level of the signal at the second node N2 is the invalid level. For example, the fifth transistor T5 is a P-type transistor, a low level of the signal at the second node N2 is the active level, and a high level of the signal at the second node N2 is the invalid level.

In the embodiment of the disclosure, as shown in FIG. 3, the shift register unit further includes:

a first control circuit 50, coupled with the third node N3, and configured to provide the signal from the first reference signal terminal VGL to the third node N3 in response to the signal from the first clock signal terminal CK, and provide the signal from the first clock signal terminal CK to the third node N3 in response to the signal at the first node N1; and a second control circuit 60, coupled with the signal output terminal OT, and configured to provide a signal from the second reference signal terminal VGH to the signal output terminal OT in response to the signal at the third node N3.

In the embodiments of the disclosure, as shown in FIG. 3, the first control circuit 50 includes a sixth transistor T6 and a seventh transistor T7.

A gate electrode of the sixth transistor T6 is coupled with the first clock signal terminal CK, a first electrode of the sixth transistor T6 is coupled with the first reference signal terminal VGL, and a second electrode of the sixth transistor T6 is coupled with the third node N3.

A gate electrode of the seventh transistor T7 is coupled with the first node N1, a first electrode of the seventh transistor T7 is coupled with the first clock signal terminal CK, and a second electrode of the seventh transistor T7 is coupled with the third node N3.

In a specific implementation, the sixth transistor T6 may be turned on under the control of the active level of the first clock signal transmitted from the first clock signal terminal CK, and may be turned off under the control of the invalid level of the first clock signal. For example, the sixth transistor T6 is an N-type transistor, a high level of the first clock signal is the active level and a low level of the first clock signal is the invalid level. For example, the sixth transistor T6 is a P-type transistor, a low level of the first clock signal is the active level, and a high level of the first clock signal is the invalid level.

In a specific implementation, the seventh transistor T7 may be turned on under the control of the active level of the signal at the first node N1, and may be turned off under the control of the invalid level of the signal at the first node N1. For example, the seventh transistor T7 is an N-type transistor, a high level of the signal at the first node N1 is the active level, and a low level of the signal at the first node N1 is the invalid level. For example, the seventh transistor T7 is a P-type transistor, a low level of the signal at the first node N1 is the active level, and a high level of the signal at the first node N1 is the invalid level.

In the embodiments of the disclosure, as shown in FIG. 3, the second control circuit 60 includes an eighth transistor T8 and a third capacitor C3.

A gate electrode of the eighth transistor T8 is coupled with the third node N3, a first electrode of the eighth transistor T8 is coupled with the signal output terminal OT, and a second electrode of the eighth transistor T8 is coupled with the second reference signal terminal VGH.

A first electrode of the third capacitor C3 is coupled with the second reference signal terminal VGH, and a second electrode of the third capacitor C3 is coupled with the third node N3.

In a specific implementation, the eighth transistor T8 may be turned on under the control of the active level of the signal at the third node N3, and may be turned off under the control of the invalid level of the signal at the third node N3. For example, the eighth transistor T8 is an N-type transistor, a high level of the signal at the third node N3 is the active level, and a low level of the signal at the third node N3 is the invalid level. For example, the eighth transistor T8 is a P-type transistor, a low level of the signal at the third node N3 is the active level, and a high level of the signal at the third node N3 is the invalid level.

In a specific implementation, according to a signal flow direction, the first electrode of each of the above transistors may be used as a source electrode, and the second electrode may be used as a drain electrode; or, the first electrode is used as the drain electrode, and the second electrode is used as the source electrode, which is not specifically distinguished here.

It should be noted that the transistors referred to in the embodiment of the disclosure may be thin film transistors (TFTs) or metal-oxide semiconductor (MOS) field-effect transistors, which is not limited here.

In the embodiments of the disclosure, the transistors may be all set as P-type transistors, the first reference signal terminal VGL may be configured to be loaded with a constant first reference voltage, and the first reference voltage is generally negative, for example, −9 V. In addition, the second reference signal terminal VGH may be loaded with a constant second reference voltage, and the second reference voltage may be generally positive, for example, 7 V. In practical applications, a specific value of the above voltage may be designed and determined according to an actual application environment, which is not limited here. Certainly, the above transistors may be all set as N-type transistors, which is not limited here.

A working process of the shift register unit provided in the embodiments of the disclosure is described below by taking the shift register unit shown in FIG. 3 as an example and combining with a timing chart of signals shown in FIG. 4.

In the following description, "1" indicates a high-level signal, "0" indicates a low-level signal, ip indicates the input signal from the signal input terminal IP, ck indicates the first clock signal from the first clock signal terminal CK, cb indicates the second clock signal from the second clock signal terminal CB, and ot indicates the output signal of the signal output terminal OT. It should be noted that 1 and 0 are logic levels that are intended only to better explain a specific working process of the embodiments of the disclosure, and are not a voltage applied to the gate electrode of each transistor in the specific implementation.

Figure 4:
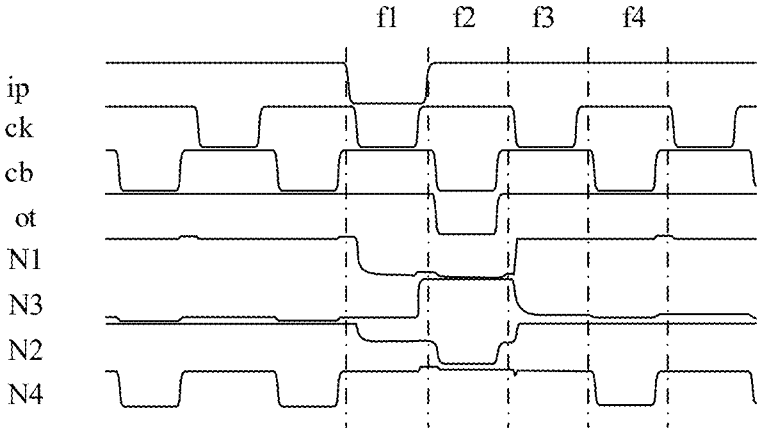
FIG. 4 is a timing chart of some signals provided in embodiments of the disclosure.

Specifically, a voltage value of the first reference signal output from the first reference signal terminal VGL being negative, a voltage value of the second reference signal output from the second reference signal terminal VGH being positive, and all the transistors being the P-type transistors are taken as an example for illustration, and a first stage f1, a second stage f2, a third stage f3 and a fourth stage f4 are selected from the signal timing chart shown in FIG. 4. It should be noted that the signal timing chart shown in FIG. 4 is only for a working process of a certain shift register unit in a current frame, and a working process of the shift register unit in other frames is basically the same as that in the current frame, which is not repeated here.

Since the gate electrode of the fourth transistor T4 is coupled with the first reference signal terminal VGL, and the low-level signal is input from the first reference signal terminal VGL, the fourth transistor T4 is always in an active state, and for ease of description, the state of the fourth transistor T4 at any moment is no longer analyzed below.

In the first stage f1, ip=0, ck=0, and cb=1.

Since the input signal ip is at the low level, the first clock signal ck is at the low level, and the second clock signal cb is at the high level, the third transistor T3 is turned on, the input signal ip at the low level is provided to the first node N1 and the second node N2, the fifth transistor T5 and the seventh transistor T7 are both turned on, the third node N3 is at the low level, the second transistor T2 and the eighth transistor T8 are both turned on, the fourth node N4 is the high level, and the first transistor T1 is turned off; and moreover, the sixth transistor T6 is turned on, and then the signal output from the signal output terminal OT is the high level.

In the second stage f2, ip=1, ck=1, and cb=0.

Since the input signal ip is at the high level, the first clock signal ck is at the high level, and the second clock signal cb is at the low level, the third transistor T3 is turned off, the second node N2 is kept at the low level, the first node N1 is at the low level, the fifth transistor T5 and the seventh transistor T7 are both turned on, the first clock signal ck at the high level is provided to the third node N3, the second transistor T2 and the eighth transistor T8 are both turned off, the fourth node N4 is kept at the high level, and the first transistor T1 is turned off; and moreover, the sixth transistor T6 is turned off, and then the signal output from the signal output terminal OT is the low level.

In the third stage f3, ip=1, ck=0, and cb=1.

since the input signal ip is at the high level, the first clock signal ck is at the low level, and the second clock signal cb is at the high level, then the third transistor T3 is turned on, the input signal ip at the high level is provided to the first node N1 and the second node N2, the fifth transistor T5 and the seventh transistor T7 are both turned off, the signal of the third node N3 is at the low level, the second transistor T2 and the eighth transistor T8 are both turned on, the fourth node N4 is kept at the high level, and the first transistor T1 is turned off; and moreover, the sixth transistor T6 is turned on, and then the signal output from the signal output terminal OT is the high level.

In the fourth stage f4, ip=1, ck=1, and cb=0.

Since the input signal ip is at the high level, the first clock signal ck is at the high level, and the second clock signal is at the low level, then, the third transistor T3 and the sixth transistor T6 are both turned off, the third node N3 is kept at the low level, the second transistor T2 and the eighth transistor T8 are both turned on, the fourth node N4 is at the low level, the first transistor T1 is turned on, the first node N1 and the second node N2 are at the high level, the fifth transistor T5 and the seventh transistor T7 are both turned off, and then the signal output from the signal output terminal OT is the high level.

Figure 5:
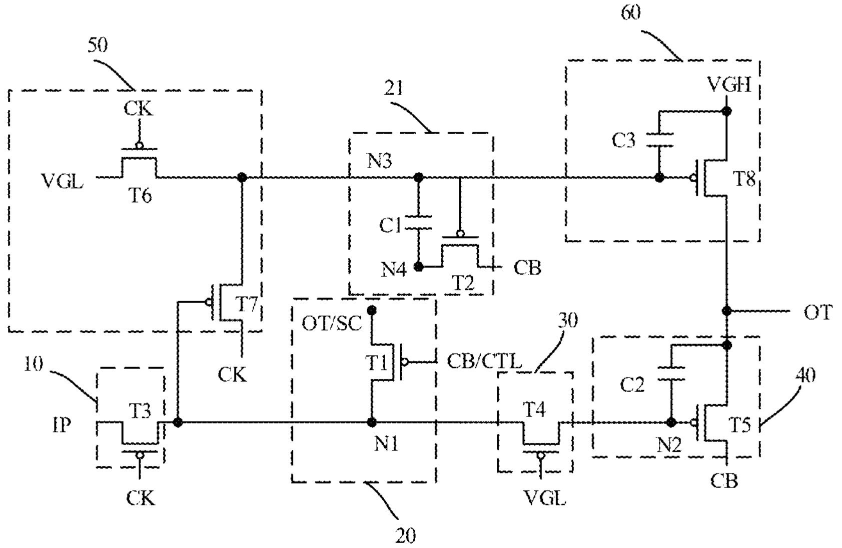
FIG. 5 is another schematic structural diagram of some structures of a shift register unit provided in embodiments of the disclosure.

An embodiment of the disclosure further provides another schematic structural diagram of a shift register unit. As shown in FIG. 5, the embodiment shows a variation of the implementation in the above embodiment. Differences between this embodiment and the above embodiment are only illustrated below, and the rough similarities are not repeated here.

In the embodiment of the disclosure, as shown in FIG. 5, the first stabilizer circuit 20 includes the first transistor T1, the first electrode of the first transistor T1 is coupled with the first node N1, the second electrode of the first transistor T1 is coupled with the stability control signal terminal SC, and the gate electrode of the first transistor T1 is coupled with the switch control signal terminal CTL.

In the embodiment of the disclosure, as shown in FIG. 5, the shift register unit further includes the second stabilizer circuit 21, and the second stabilizer circuit 21 includes the first capacitor C1 and the second transistor T2. The gate electrode of the second transistor T2 and the first electrode of the first capacitor C1 are both coupled with the third node N3, the first electrode of the second transistor T2 is coupled with the second clock signal terminal CB, and the second electrode of the second transistor T2 is coupled with the second electrode of the first capacitor C1.

In the embodiment of the disclosure, as shown in FIG. 5, the switch control signal terminal CTL and the second clock signal terminal CB are the same signal terminal.

For example, the switch control signal terminal CTL and the second clock signal terminal CB may be coupled together, which may reduce the quantity of signal lines and reduce the difficulty of wiring.

In the embodiment of the disclosure, as shown in FIG. 5, the stability control signal terminal SC and the signal output terminal OT are the same signal terminal.

For example, the stability control signal terminal SC and the signal output terminal OT may be coupled together, which may reduce the quantity of signal lines and reduce the difficulty of wiring.

Based on the above embodiment, the first transistor T1 is controlled by the second clock signal of the second clock signal terminal CB to be turned on or off. The rest of the working process can refer to the description of the above embodiment, which is not repeated here.

The working process of the shift register unit provided in the embodiment of the disclosure is described below by taking the shift register unit shown in FIG. 5 as an example and combining with a signal timing chart shown in FIG. 6. In the following description, "1" indicates the high-level signal, "0" indicates the low-level signal, ip indicates the input signal from the signal input terminal IP, ck indicates the first clock signal from the first clock signal terminal CK, cb indicates the second clock signal from the second clock signal terminal CB, and ot indicates the output signal from the signal output terminal OT. It should be noted that 1 and 0 are the logic levels that are intended only to better explain the specific working process of the embodiment of the disclosure, and are not the voltage applied to the gate electrode of each transistor in the specific implementation.

Figure 6:
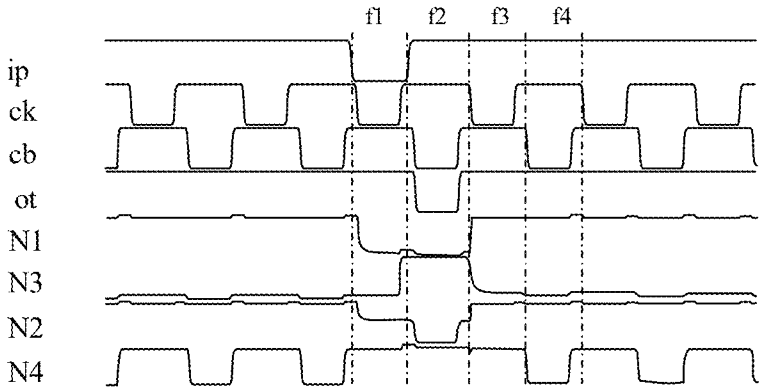
FIG. 6 is another timing chart of some signals provided in embodiments of the disclosure.

Specifically, the voltage value of the first reference signal output from the first reference signal terminal VGL being negative, the voltage value of the second reference signal output from the second reference signal terminal VGH being positive, and all the transistors being the P-type transistors are taken as an example for illustration, and a first stage f1, a second stage f2, a third stage f3 and a fourth stage f4 are selected from the signal timing chart shown in FIG. 6. It should be noted that the signal timing chart shown in FIG. 6 is only for a working process of a certain shift register unit in a current frame, and a working process of the shift register unit in other frames is basically the same as that in the current frame, which is not repeated here.

Since the gate electrode of the fourth transistor T4 is coupled with the first reference signal terminal VGL, and the low-level signal is input from the first reference signal terminal VGL, the fourth transistor T4 is always in an active state, and for ease of description, the state of the fourth transistor T4 at any moment is no longer analyzed below.

In the first stage f1, ip=0, ck=0, and cb=1.

Since the input signal ip is at the low level, the first clock signal ck is at the low level, and the second clock signal cb is at the high level, the third transistor T3 is turned on, the input signal ip at the low level is provided to the first node N1 and the second node N2, the fifth transistor T5 and the seventh transistor T7 are both turned on, the first reference signal at the low level is provided to the third node N3, the third node N3 is at the low level, the second transistor T2 and the eighth transistor T8 are both turned on, and the fourth node N4 is at the high level; and moreover, the first transistor T1 is turned off, the sixth transistor T6 is turned on, and then the signal output from the signal output terminal OT is the high level.

In the second stage f2, ip=1, ck=1, and cb=0.

Since the input signal ip is at the high level, the first clock signal ck is at the high level, and the second clock signal cb is at the low level, the third transistor T3 is turned off, the first node N1 and the second node N2 are kept at the low level, the fifth transistor T5 and the seventh transistor T7 are both turned on, the first clock signal ck at the high level is provided to the third node N3, the second transistor T2 and the eighth transistor T8 are both turned off, and the fourth node N4 is kept at the high level; and moreover, the first transistor T1 is turned on, the sixth transistor T6 is turned off, and then the signal output from the signal output terminal OT is the low level.

In the third stage f3, ip=1, ck=0, and cb=1.

Since the input signal ip is at the high level, the first clock signal ck is at the low level, and the second clock signal cb is at the high level, then the third transistor T3 is turned on, the input signal ip at the high level is provided to the first node N1 and the second node N2, the fifth transistor T5 and the seventh transistor T7 are both turned off, the third node N3 is at the low level, the second transistor T2 and the eighth transistor T8 are both turned on, and the fourth node N4 is kept at the high level; and moreover, the first transistor T1 is turned off, the sixth transistor T6 is turned on, and then the signal output from the signal output terminal OT is the high level.

In the fourth stage f4, ip=1, ck=1, and cb=0.

Since the input signal ip is at the high level, the first clock signal ck is at the high level, and the second clock signal is at the low level, then, the third transistor T3 is turned off, the first node N1 and the second node N2 are kept at the high level, the fifth transistor T5 and the seventh transistor T7 are both turned off, the third node N3 is at the low level, the second transistor T2 and the eighth transistor T8 are both turned on, and the fourth node N4 is at the low level; and moreover, the first transistor T1 is turned on, the sixth transistor T6 is turned off, and then the signal output from the signal output terminal OT is the high level.

Figure 7:
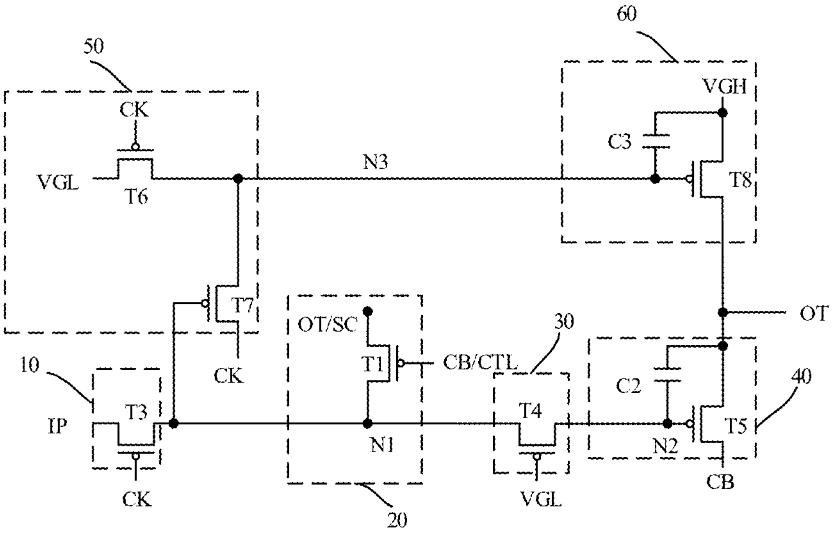
FIG. 7 is another schematic structural diagram of some structures of a shift register unit provided in embodiments of the disclosure.

An embodiment of the disclosure further provides yet another schematic structural diagram of a shift register unit. As shown in FIG. 7, the embodiment is a variation of the implementation in the above embodiment. Differences between this embodiment and the above embodiment are only illustrated below, and the rough similarities are not repeated here.

In the embodiment of the disclosure, as shown in FIG. 7, the first stabilizer circuit 20 includes the first transistor T1. The first electrode of the first transistor T1 is coupled with the first node N1, the second electrode of the first transistor T1 is coupled with the stability control signal terminal SC, and the gate electrode of the first transistor T1 is coupled with the switch control signal terminal CTL.

In the embodiment of the disclosure, as shown in FIG. 7, the switch control signal terminal CTL and the second clock signal terminal CB are the same signal terminal.

In the embodiment of the disclosure, as shown in FIG. 7, the stability control signal terminal SC and the signal output terminal OT are the same signal terminal.

Based on the above embodiment, the first transistor T1 is controlled by the second clock signal from the second clock signal terminal CB to be turned on or off. The rest of the working process can refer to the description of the above embodiment, which is not repeated here.

Compared with FIG. 3 and FIG. 5, the exemplary embodiment shown in FIG. 7 saves layout space.

The above are only examples of specific structures of the shift register unit provided in the embodiments of the disclosure. During specific implementation, a specific structure of each circuit is not limited to the above structure provided in the embodiments of the disclosure, but may be other structures known by those skilled in the art, which is not limited here.

Based on the same conception, embodiments of the disclosure further provide a drive control circuit, including a plurality of cascaded shift register units. A signal input terminal of a first shift register unit is coupled with a frame trigger signal terminal; and in every two adjacent shift register units, a signal input terminal IP of a next shift register unit is coupled with a signal output terminal of a previous shift register unit.

Figure 8:
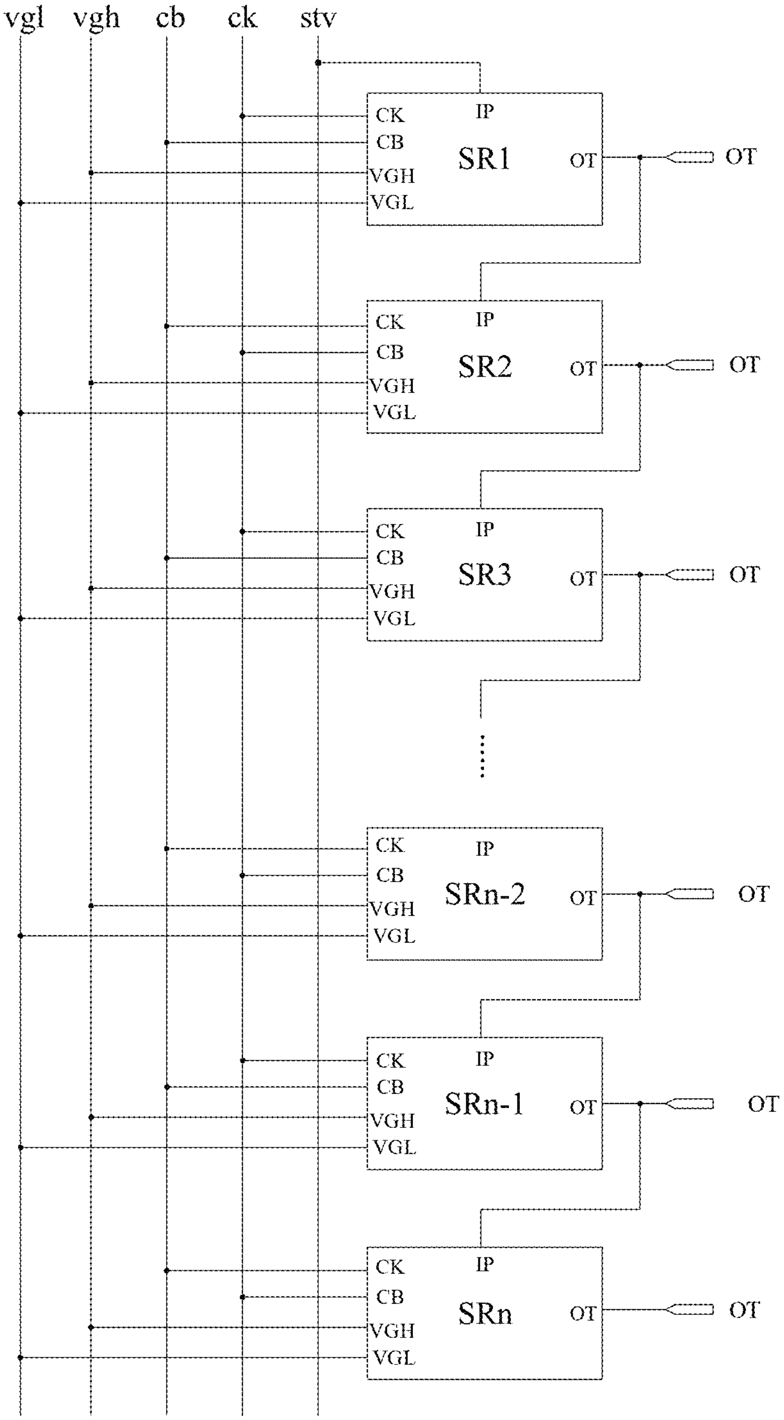
FIG. 8 is a schematic structural diagram of some structures of a drive control circuit provided in embodiments of the disclosure.

For example, as shown in FIG. 8, the drive control circuit includes the plurality of cascaded shift register units SR1, SR2, SR3, . . . SRn-2, SRn-1 and SRn, where n is a natural number. A value of n depends on actual design requirements. The shift register units adopt the shift register units as shown in FIG. 3, FIG. 5 or FIG. 7. Each shift register unit includes the signal input terminal IP, the signal output terminal, the first clock signal terminal and the second clock signal terminal. Each terminal is provided with a signal indicated by the timing chart shown in FIG. 4: the signal input terminal IP of the shift register unit SR1 is coupled with a frame trigger signal terminal STV, stv indicates a frame trigger signal provided by the frame trigger signal terminal STV. In each of the rest shift register units, the signal output terminal of the previous shift register unit is coupled with the signal input terminal IP of the next shift register unit, that is, the signal output from the signal output terminal of the shift register unit SR1 may be used as the signal for the signal input terminal IP of the shift register unit SR2, the signal output from the signal output terminal of the shift register unit SR2 may be used as the signal for the signal input terminal IP of the shift register unit SR3 . . . , and the signal from the signal output terminal of the shift register unit SRn-1 may be used as the signal for the signal input terminal IP of the shift register unit SRn, until there is no next shift register unit. The first clock signal terminal accesses the first clock signal, and the second clock signal terminal accesses the second clock signal. Timing of the drive control circuit shown in FIG. 8 may be obtained through deduction according to a connection relationship of each shift register unit and the timing shown in FIG. 4, which is not repeated here.

Based on the same conception, an embodiment of the disclosure further provides a display apparatus, including a plurality of pixel units, a plurality of signal lines, and the drive control circuit provided in the embodiments of the disclosure. The signal output terminal of one shift register unit in the drive control circuit is coupled with at least one signal line in the plurality of signal lines. The principle of solving the problem by the display apparatus is similar to that of the above drive control circuit, so the implementation of the display apparatus may refer to the implementation of the above drive control circuit, and the repetition is not repeated here.

In the specific implementation, in the embodiment of the disclosure, the display apparatus may be: a mobile phone, a tablet computer, a television set, a display, a laptop computer, a digital photo frame, a navigator, and any other product or component with a display function. Other essential components of the display apparatus should be understood by those ordinarily skilled in the art, which are not repeated here, nor shall they be used as a limitation of the disclosure.

In specific implementation, the display apparatus may include a plurality of pixel units, a plurality of gate lines and data lines. Each pixel unit may include a plurality of sub-pixels, such as red sub-pixels, green sub-pixels and blue sub-pixels. The display apparatus provided in the embodiments of the disclosure may be an organic light-emitting display apparatus or a liquid crystal display apparatus, which is not limited here.

In the embodiments of the disclosure, the plurality of gate lines are also correspondingly provided with a drive control circuit; and one gate line is coupled with a signal output terminal of one shift register unit in the drive control circuit. For example, when the display apparatus provided in the embodiments of the disclosure is a liquid crystal display apparatus, TFTs in the sub-pixels may be coupled with the gate lines, and the drive control circuits may be used as gate driver circuit, and the gate drive circuit is coupled with the gate lines and configured to provide gate scan signals to the TFTs in the sub-pixels. It should be noted that the TFTs in the sub-pixels may be N-type transistors or P-type transistors, which is not limited here.

In some embodiments of the disclosure, when the display apparatus provided in the embodiments of the disclosure is an organic light-emitting display apparatus, the display apparatus further includes a plurality of light-emitting control signal lines. The plurality of light-emitting control signal lines are correspondingly provided with a drive control circuit. One light-emitting control signal line is coupled to a signal output terminal of one shift register unit in the drive control circuit. In addition, the plurality of gate lines are also correspondingly provided with a drive control circuit. One gate line is coupled to a signal output terminal of one shift register unit in the drive control circuit. For example, in the organic light-emitting display apparatus, there are generally a plurality of organic light-emitting diodes and pixel circuits connected with the respective organic light-emitting diodes. Each pixel circuit is generally provided with a light-emitting control transistor for controlling the light emission of the organic light-emitting diode and a scanning control transistor for controlling the data signal input.

In the specific implementation, the light-emitting control transistors may be coupled with the light-emitting control signal lines, and the scanning control transistors may be coupled with the gate lines. The organic light-emitting display apparatus may include the drive control circuit provided in the embodiments of the disclosure, the drive control circuit may be used as a light-emitting drive circuit, and the light-emitting drive circuit is coupled with the light-emitting control transistors and configured to provide a light-emitting control signal for the light-emitting control transistors. Alternatively, the drive control circuit may be used as a gate drive circuit, and the gate drive circuit is coupled with the gate lines and configured to provide gate scanning signals for the scanning control transistor.

Certainly, the organic light-emitting display apparatus may also include two drive control circuits provided in the embodiments of the disclosure, one of which may be used as a light-emitting drive circuit coupled with the light-emitting control transistors and configured to provide a light-emitting control signal for the light-emitting control transistors; and the other drive control circuit is used as the gate drive circuit, is coupled with the gate lines and configured to provide a gate scanning signal for the scanning control transistor, which is not limited here.

Figure 9:
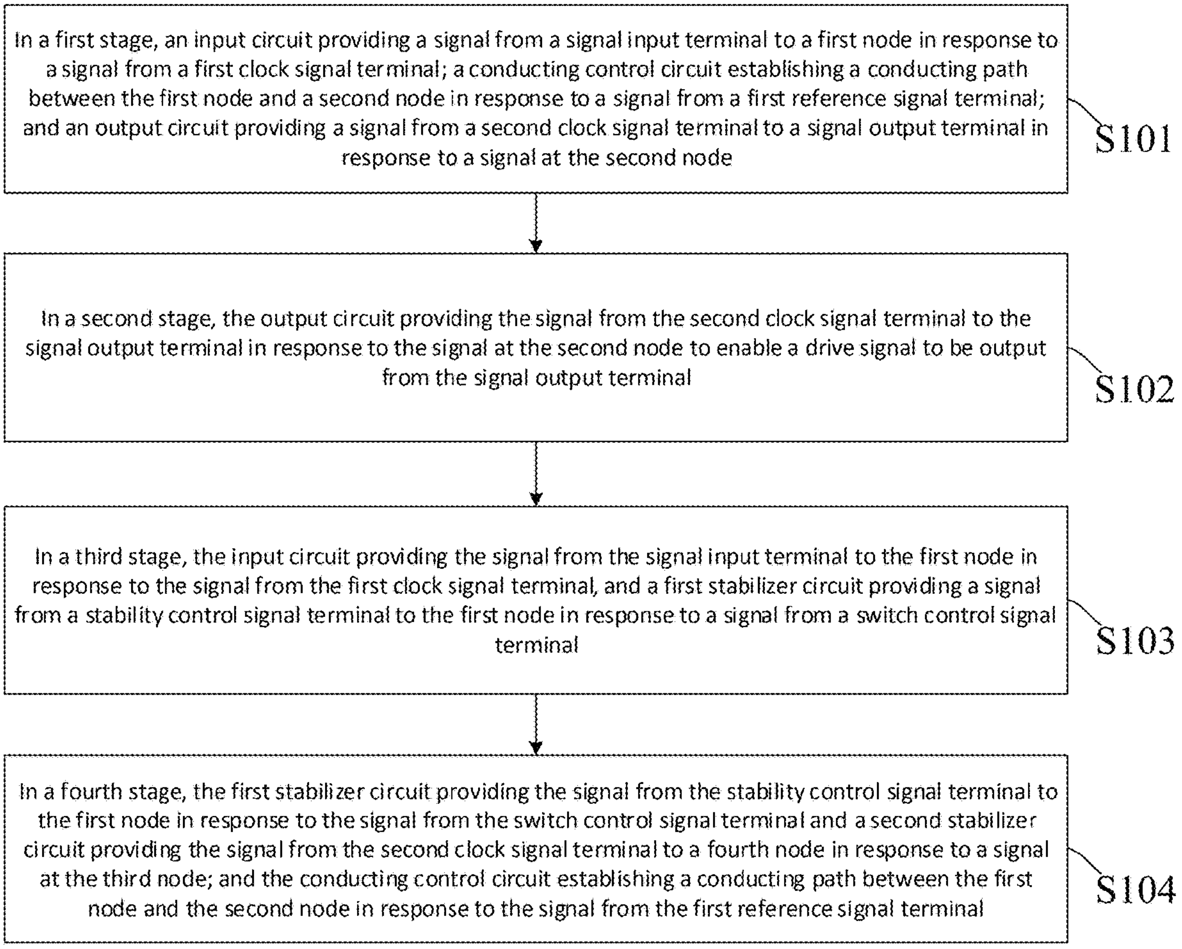
FIG. 9 is a flow chart of a drive method of a shift register unit provided in embodiments of the disclosure.

Based on the same conception, as shown in FIG. 9, embodiments of the disclosure provide a drive method for the above shift register unit, including:

S101: in a first stage, an input circuit providing a signal from a signal input terminal to a first node in response to a signal from a first clock signal terminal; a conducting control circuit establishing a conducting path between the first node and a second node in response to a signal from a first reference signal terminal; and an output circuit providing a signal from a second clock signal terminal to a signal output terminal in response to a signal at the second node;

S102: in a second stage, the output circuit providing the signal from the second clock signal terminal to the signal output terminal in response to the signal at the second node to enable a drive signal to be output from the signal output terminal; and S103: in a third stage, the input circuit providing the signal from the signal input terminal to the first node in response to the signal from the first clock signal terminal, and a first stabilizer circuit providing a signal from a stability control signal terminal to the first node in response to a signal from a switch control signal terminal.

In the embodiments of the disclosure, as shown in FIG. 9, after the third stage, the drive method further includes:

S104: in a fourth stage, the first stabilizer circuit providing the signal from the stability control signal terminal to the first node in response to the signal from the switch control signal terminal and a second stabilizer circuit providing the signal from the second clock signal terminal to a fourth node in response to a signal at the third node; and the conducting control circuit establishing a conducting path between the first node and the second node in response to the signal from the first reference signal terminal.

In the embodiments of the disclosure, the drive method further includes:

in the first stage, a first control circuit providing the signal from the first reference signal terminal to the third node by in response to the signal from the first clock signal terminal, and providing the signal from the first clock signal terminal to the third node in response to the signal at the first node; and a second control circuit providing a signal from a second reference signal terminal to the signal output terminal in response to the signal at the third node;

in the second stage, the first control circuit providing the signal from the first clock signal terminal to the third node in response to the signal at the first node;

in the third stage, the first control circuit providing the signal from the first reference signal terminal to the third node in response to the signal from the first clock signal terminal; and the second control circuit providing the signal from the second reference signal terminal to the signal output terminal in response to the signal at the third node; and in the fourth stage, the second control circuit providing the signal from the second reference signal terminal to the signal output terminal in response to the signal at the third node.

The principle and specific implementation of the drive method are the same as those of the shift register unit in the above embodiment. Therefore, the drive method may be implemented by referring to the specific implementation of the shift register unit in the above embodiment, which is not repeated here.

Although preferred embodiments of the disclosure have been described, additional changes and modifications may be made to these embodiments once the basic creative concepts are known to those skilled in the art. Accordingly, the appended claims are intended to be construed to include the preferred embodiments and all changes and modifications falling within the scope of the disclosure.

Obviously, those skilled in the art may make various changes and variations to the disclosure without deviating from the spirit and scope of the disclosure. Thus, if these modifications and variations of the disclosure are within the scope of the claims of the disclosure and their equivalents, the disclosure is also intended to include such modifications and variations.

with the signal input terminal, and a second electrode of the third transistor is coupled with the first node.

What is claimed is:

1. A shift register unit, comprising:

an input circuit, coupled with a signal input terminal, a first clock signal terminal and a first node, and configured to provide a signal from the signal input terminal to the first node in response to a signal from the first clock signal terminal;

a first stabilizer circuit, coupled with the first node, a switch control signal terminal and a stability control signal terminal, and configured to provide a signal from the stability control signal terminal to the first node in response to a signal from the switch control signal terminal;

a conducting control circuit, coupled with the first node and a second node, and configured to establish a conducting path between the first node and the second node in response to a signal from a first reference signal terminal;

an output circuit, coupled with the second node, a second clock signal terminal and a signal output terminal, and configured to provide a signal from the second clock signal terminal to the signal output terminal in response to a signal at the second node to allow a drive signal to be output from the signal output terminal; and a second stabilizer circuit, wherein the second stabilizer circuit comprises a first capacitor and a second transistor; and a gate electrode of the second transistor and a first electrode of the first capacitor are both coupled with a third node, a first electrode of the second transistor is coupled with the second clock signal terminal, and a second electrode of the second transistor is coupled with a second electrode of the first capacitor.

2. The shift register unit according to claim 1, wherein the first stabilizer circuit comprises a first transistor;

wherein a first electrode of the first transistor is coupled with the first node, a second electrode of the first transistor is coupled with the stability control signal terminal, and a gate electrode of the first transistor is coupled with the switch control signal terminal.

3. The shift register unit according to claim 1, wherein the switch control signal terminal is coupled with the second electrode of the first capacitor.

4. The shift register unit according to claim 2, wherein the switch control signal terminal and the second clock signal terminal are a same signal terminal.

5. The shift register unit according to claim 2, wherein the stability control signal terminal and the signal output terminal are a same signal terminal.

6. The shift register unit according to claim 1, wherein the input circuit comprises a third transistor;

wherein a gate electrode of the third transistor is coupled with the first clock signal terminal, a first electrode of the third transistor is coupled with the signal input terminal, and a second electrode of the third transistor is coupled with the first node.

7. The shift register unit according to claim 1, wherein the conducting control circuit comprises a fourth transistor;

wherein a gate electrode of the fourth transistor is coupled with the first reference signal terminal, a first electrode of the fourth transistor is coupled with the first node, and a second electrode of the fourth transistor is coupled with the second node.

8. The shift register unit according to claim 1, wherein the output circuit comprises a second capacitor and a fifth transistor;

a first electrode of the second capacitor and a gate electrode of the fifth transistor are both coupled with the second node; and a first electrode of the fifth transistor is coupled with the second clock signal terminal, and a second electrode of the fifth transistor and a second electrode of the second capacitor are both coupled with the signal output terminal.

9. The shift register unit according to claim 1, further comprising:

a first control circuit, coupled with the third node, and configured to provide the signal from the first reference signal terminal to the third node in response to the signal at the first clock signal terminal, and provide the signal from the first clock signal terminal to the third node in response to the signal of the first node; and a second control circuit, coupled with the signal output terminal, and configured to provide a signal from a second reference signal terminal to the signal output terminal in response to a signal at the third node.

10. The shift register unit according to claim 9, wherein the first control circuit comprises a sixth transistor and a seventh transistor;

a gate electrode of the sixth transistor is coupled with the first clock signal terminal, a first electrode of the sixth transistor is coupled with the first reference signal terminal, and a second electrode of the sixth transistor is coupled with the third node; and a gate electrode of the seventh transistor is coupled with the first node, a first electrode of the seventh transistor is coupled with the first clock signal terminal, and a second electrode of the seventh transistor is coupled with the third node.

11. The shift register unit according to claim 9, wherein the second control circuit comprises an eighth transistor and a third capacitor;

a gate electrode of the eighth transistor is coupled with the third node, a first electrode of the eighth transistor is coupled with the signal output terminal, and a second electrode of the eighth transistor is coupled with the second reference signal terminal; and a first electrode of the third capacitor is coupled with the second reference signal terminal, and a second electrode of the third capacitor is coupled with the third node.

12. A drive control circuit, comprising:

a plurality of cascaded shift register units according to claim 1; wherein a signal input terminal of a first shift register unit is coupled with a frame trigger signal terminal; and in every two adjacent levels of shift register units, a signal input terminal of a next shift register unit is coupled with a signal output terminal of a previous shift register unit.

13. A display apparatus, comprising the drive control circuit according to claim 12.

14. A drive method of a shift register unit, wherein the shift register unit comprises:

an input circuit, coupled with a signal input terminal, a first clock signal terminal and a first node, and configured to provide a signal from the signal input terminal to the first node in response to a signal from the first clock signal terminal;

a first stabilizer circuit, coupled with the first node, a switch control signal terminal and a stability control signal terminal, and configured to provide a signal from the stability control signal terminal to the first node in response to a signal from the switch control signal terminal;

a conducting control circuit, coupled with the first node and a second node, and configured to establish a conducting path between the first node and the second node in response to a signal from a first reference signal terminal;

an output circuit, coupled with the second node, a second clock signal terminal and a signal output terminal, and configured to provide a signal from the second clock signal terminal to the signal output terminal in response to a signal at the second node to allow a drive signal to be output from the signal output terminal; and a second stabilizer circuit, wherein the second stabilizer circuit comprises a first capacitor and a second transistor; and a gate electrode of the second transistor and a first electrode of the first capacitor are both coupled with a third node, a first electrode of the second transistor is coupled with the second clock signal terminal, and a second electrode of the second transistor is coupled with a second electrode of the first capacitor;

wherein the drive method comprises:

in a first stage, the input circuit providing a signal from the signal input terminal to the first node in response to the signal from the first clock signal terminal; the conducting control circuit establishing a conducting path between the first node and a second node in response to the signal from the first reference signal terminal; and the output circuit providing the signal from the second clock signal terminal to the signal output terminal in response to the signal at the second node;

in a second stage, the output circuit providing the signal from the second clock signal terminal to the signal output terminal in response to the signal at the second node to allow the drive signal to be output from the signal output terminal; and in a third stage, the input circuit providing the signal from the signal input terminal to the first node in response to the signal from the first clock signal terminal; and the first stabilizer circuit providing the signal from the stability control signal terminal to the first node in response to the signal from the switch control signal terminal.

15. The drive method according to claim 14, wherein after the third stage, the drive method further comprises:

in a fourth stage, the first stabilizer circuit providing the signal from the stability control signal terminal to the first node in response to the signal from the switch control signal terminal and a second stabilizer circuit providing the signal from the second clock signal terminal to a fourth node in response to a signal at the third node; and the conducting control circuit establishing a conducting path between the first node and the second node in response to the signal from the first reference signal terminal.

16. The drive method according to claim 15, further comprising:

in the first stage, a first control circuit providing the signal from the first reference signal terminal to the third node in response to the signal from the first clock signal terminal, and providing the signal from the first clock signal terminal to the third node in response to the signal at the first node; and a second control circuit providing a signal at a second reference signal terminal to the signal output terminal in response to the signal at the third node;

in the second stage, the first control circuit providing the signal from the first clock signal terminal to the third node in response to the signal at the first node;

in the third stage, the first control circuit providing the signal from the first reference signal terminal to the third node in response to the signal from the first clock signal terminal; and the second control circuit providing the signal from the second reference signal terminal to the signal output terminal in response to the signal at the third node; and in the fourth stage, the second control circuit providing the signal from the second reference signal terminal to the signal output terminal in response to the signal at the third node.

17. The shift register unit according to claim 9, wherein the stability control signal terminal and the second reference signal terminal are a same signal terminal.

* * * * *